United States Patent [19]
Giesecke et al.

[11] Patent Number: 5,238,702
[45] Date of Patent: Aug. 24, 1993

[54] ELECTRICALLY CONDUCTIVE PATTERNS

[76] Inventors: Henning Giesecke, Bayer AG, D 5090 Leverkusen, Bayerwerk; Horst D. Wilde, Pregelstrasse 2a, D 5828 Ennepetal; Bonack Armin, DSchwertstrasse 45, D 5650 Solingen, all of Fed. Rep. of Germany

[21] Appl. No.: 866,088

[22] Filed: Apr. 6, 1992

Related U.S. Application Data

[60] Continuation of Ser. No. 672,005, Mar. 18, 1991, abandoned, which is a division of Ser. No. 539,765, Jun. 18, 1990, abandoned, which is a continuation of PCT/EP89/01268, Oct. 24, 1989, abandoned.

[30] Foreign Application Priority Data

Oct. 27, 1988 [DE] Fed. Rep. of Germany ....... 3836605
Sep. 26, 1989 [DE] Fed. Rep. of Germany ....... 3932017

[51] Int. Cl.$^5$ ............................................. B05B 5/12
[52] U.S. Cl. ...................................... 427/78; 427/123; 427/271; 427/299; 427/372.2; 427/443.1
[58] Field of Search ............ 427/98, 443.1, 123, 427/271, 299, 372.2

[56] References Cited

U.S. PATENT DOCUMENTS

| | | | |
|---|---|---|---|
| 3,370,351 | 2/1968 | Freehauf et al. | 361/396 |
| 4,368,281 | 1/1983 | Brummett et al. | 174/259 |
| 4,388,351 | 6/1983 | Sawyer | 427/98 |
| 4,472,458 | 9/1984 | Sirinyan et al. | 427/443.1 |
| 4,504,607 | 3/1985 | Leech | 428/901 |
| 4,514,784 | 4/1985 | Williams et al. | 361/396 |
| 4,575,467 | 3/1986 | Sirinyan et al. | 427/304 |
| 4,659,592 | 4/1987 | Sirinyan et al. | 427/78 |
| 4,666,742 | 5/1987 | Takakura et al. | 428/457 |
| 4,728,751 | 3/1988 | Canestaro | 174/68.5 |
| 4,753,821 | 6/1988 | Giesecke et al. | 427/443.1 |
| 4,764,401 | 8/1988 | Sirinyan et al. | 427/304 |
| 4,783,722 | 11/1988 | Osaki et al. | 361/412 |
| 4,830,714 | 5/1989 | Sirinyan et al. | 427/443.1 |
| 4,832,989 | 5/1989 | Giesecke et al. | 427/306 |
| 4,847,446 | 7/1989 | King et al. | 361/414 |
| 4,868,712 | 9/1989 | Woodman et al. | 361/396 |
| 4,910,045 | 3/1990 | Giesecke et al. | 427/98 |
| 4,961,806 | 10/1990 | Gerrie et al. | 361/412 |

FOREIGN PATENT DOCUMENTS

| | | |
|---|---|---|
| 1169720 | 6/1984 | Canada . |
| 1271374 | 7/1990 | Canada . |
| 0044247 | 1/1982 | European Pat. Off. . |
| 0075890 | 4/1983 | European Pat. Off. . |
| 3148280 | 6/1983 | Fed. Rep. of Germany . |
| 3627256 | 2/1988 | Fed. Rep. of Germany . |
| 8802592 | 4/1988 | World Int. Prop. O. . |

*Primary Examiner*—Shrive Beck
*Assistant Examiner*—Benjamin L. Utech
*Attorney, Agent, or Firm*—Sprung, Horn, Kramer & Woods

[57] ABSTRACT

Electrically conductive patterns, printed-circuit boards for example, with integrated free-standing connection and plugging sections are obtained by the known (semi-)additive methods wherein both the circuit paths and the connection and plugging sections are metallized in one operation with the metal coating in those sections being deposited with such a low adhesion that it can easily be loosened from the surface of the substrate without damage.

9 Claims, 1 Drawing Sheet

ELECTRICALLY CONDUCTIVE PATTERNS

This application is a continuation of application Ser. No. 672,005, filed Mar. 18, 1991, now abandoned which is a division of application Ser. No. 539,765, filed Jun. 18, 1990, now abandoned which is a continuation of international application No. PCT/EP 89/01268, filed Oct. 24, 1989, now abandoned.

BACKGROUND OF THE INVENTION

1. Field of Invention

The present invention concerns electrically conductive patterns, printed circuits for example. That electrically conductive patterns can be produced from metal foil applied to a base by etching away areas of the foil is already known. Due to the purity of its metal, a printed-circuit board produced in this way has the advantage of low resistance. Its high manufacturing cost, however, is a drawback.

2. Prior Art

Printed circuits can be produced essentially less expensively and more precisely by another method, which is also appropriate for multilayered electric circuits. The electrically conductive patterns are manufactured in this method by imprinting, especially screening, an insulating base in a conductive ink that has the consistency of a paste, a metallic-silver ink for example. The drawback of printed circuits of this type, however, is that, due to the binder in the paste and to the size of the particles, the ink is not satisfactorily conductive. It is accordingly common to print relatively thick impressions (8 to 12 mm thick). Furthermore, when silver ink is employed, the metal will migrate subject to moisture from one circuit path to an adjacent path and lead to leakage currents and even short circuits. It is accordingly necessary to protect the circuit paths with special films. Another drawback is that no components can be soldered to the strips (cf. DE 3 413 408).

Also known is a method of manufacturing printed circuits wherein a desired pattern is printed on an insulating base in an ink in the form of a paste that contains an activator and metal is deposited onto the printed sections out of a bath. The result is thin patterns of pure metal. In spite of this advantage, however, this procedure (DE 1 176 731), although it has been known for many years, has not been able to compete in practice with the two other approaches.

A method of printing electrically conductive patterns in an ink consisting of organometallic activators, organic solvents, fillers, and binders is known from German Patent 3 241 579.

In spite of the drawbacks of screened circuits of electrically conductive metal ink, especially silver, the approach has been proven practical in many applications where demands on the precision of a conductive structure are high. As the technology progresses, however, the need for precision increases. Extremely thin printed circuits that are also highly precise are required. One particular problem that occurs in satisfying these demands is how to attach narrow patterns securely and permanently enough to the base.

This requisite can, according to German Patent 3 733 002, be satisfied with an electrically conductive pattern that consists of a base with a particularly insulating surface and of a metal coating that is non-electrically deposited onto the surface out of a metallization bath along by means of an impressed substance that contains an activator, whereby the substance contains organometallic activators, fillers, organic solvents, and binders. Substances of this type will adhere tight to the surface of the substrate, and the circuit will not become unintendedly loose.

The drawback to such electrically conductive patterns is that the ends of the circuit paths cannot be loosened from the substrate to create free-standing metal connection sections. The connection and plug sections have accordingly been created up to now by a complicated method involving either attaching pins mechanically or stamping out clips.

SUMMARY

The object of the present invention is accordingly electrically conductive patterns that consist essentially of a base with an insulating surface and of a metal coating that is non-electrically deposited onto the surface out of a metallization bath by means of an impressed substance that contains an activator, whereby the substance contains organometallic activators, fillers, organic solvents, and binders. This object is characterized in that the patterns include integrated free-standing metal connection sections.

DETAILED DESCRIPTION OF THE DRAWINGS

Figure 1:
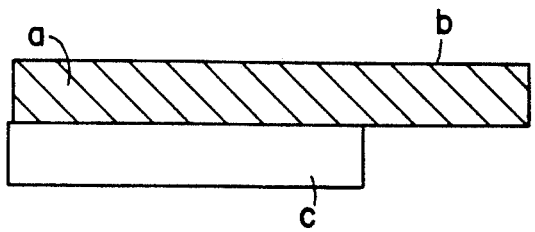
FIG. 1 depicts a profile of the electrically conductive pattern of this invention.

In FIG. 1 there is depicted a side (profile) view of the electrically conductive pattern of the invention wherein circuit pattern "a" is shown as a continuous layer having integrated free-standing connection "b". The basic substrate material "c" has been removed from beneath a portion of circuit pattern "a" to expose that part of the circuit as integrated free-standing connections.

Figure 2:
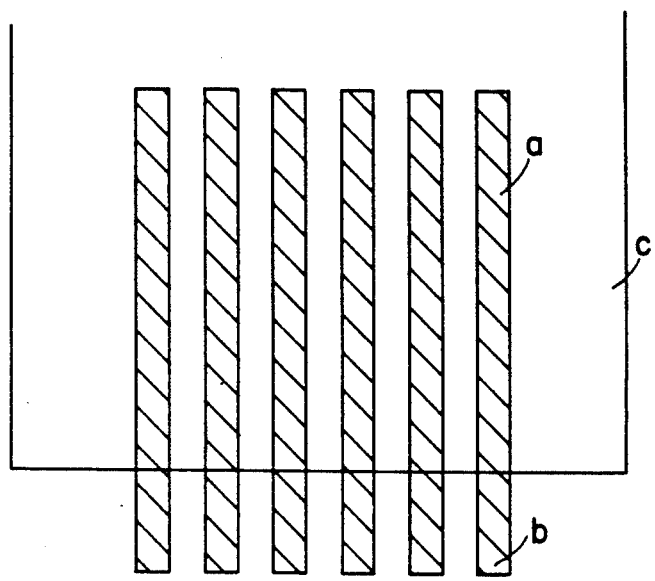
FIG. 2 depicts a top view of the electrically conductive pattern of this invention.

In FIG. 2 there is depicted a top view of the electrically conductive pattern, showing the same structure as is depicted in FIG. 1 except as viewed from the top. The connections "b" are formed by removal of a portion of substrate "c" from beneath electrically conductive pattern "a".

Figure 3:
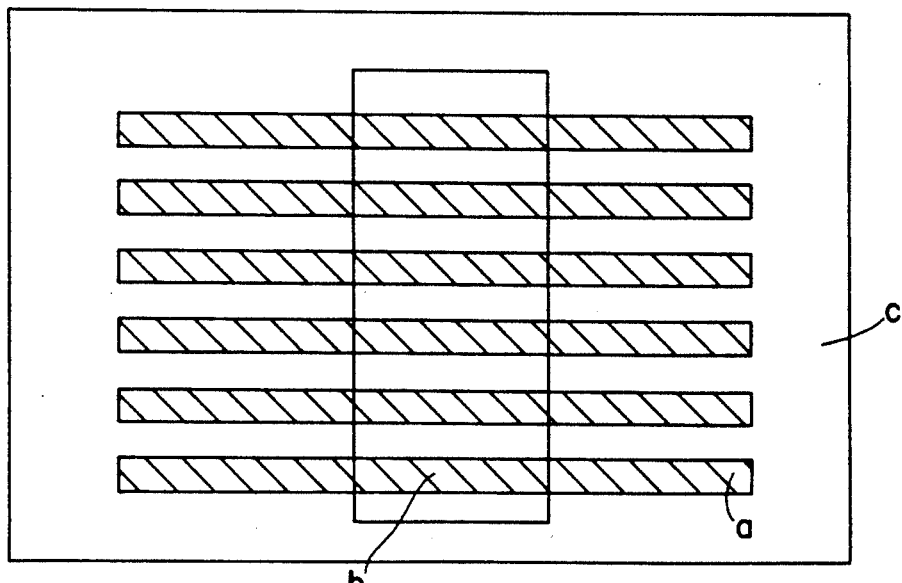
FIG. 3 depicts a top view of the electrically conductive pattern of the present invention, showing a possible removal of a central part of the substrate.

In FIG. 3 there is depicted a central area of electrically conductive pattern "a" from which a portion of substrate "c" can be removed to create central integrated free-standing connections "b".

Catalytically active formulations that are appropriate for non-electric metallizing are mentioned in German Patents 3 743 780, 3 627 256, and 3 625 587 for example.

The binders and solvents are in particular those which are a copolymer of (a) 5 to 80% by weight of a monomer containing cyano groups;

(b) 5 to 40% by weight of optionally ring-substituted (methyl)styrene and/or (c) 5 to 40 % by weight of (methyl)acrylic acid ester and/or (d) 5 to 40% by weight of unsaturated caroboxylic acid (derivative).

Preferred copolymers contain 20 to 50% by weight of the component (a).

Suitable components (a) are esters of α-cyanoacrylic acid containing 1 to 8 carbon atoms in the alcohol radical, maleodinitrile, fumarodinitrile and, in particular, acrylonitrile and α-alkylacrylonitriles such as methacrylonitrile.

Suitable components (b) are: styrene, α-methylstyrene, o-chlorostyrene, p-chlorostyrene, o-, m- or p-methylstyrene, p-tert-butylstyrene or methyl methacrylate or mixtures thereof.

Examples of components (c) are: alkyl esters of acrylic acid containing 1 to 18 carbon atoms in the alcohol radical or alkyl esters of methacrylic acid containing 2 to 18 carbon atoms in the alcohol radical or mixtures thereof.

Examples of components (d) are: β-monoolefinic unsaturated mono- or dicarboxylic acids containing 3 to 5 carbon atoms or half-esters of maleic acid containing 2 to 18 carbon atoms in the alcohol radical or mixtures thereof. Polyurethane elastomers combined with solvents that do not contain halogens are preferred.

The substances are generally produced by mixing the constituents. In addition to simple mixers, such wet-state reducers of the type common in the coating and printing industries as kneaders, attrition mills, roller mills, dissolvers, rotor-stator mills, ball mills, and agitators are particularly appropriate. The constituents of the formulation can of course be mixed in separate steps. The activator can for example be dissolved or dispersed in the binders and solvents before the fillers are mixed in. Another possible variant of the process is to introduce the fillers first subject to powerful shearing forces.

The formulations can generally be applied by procedures known from the coating and printing industries—spraying, brushing, rolling, dipping, coating, printing (e.g. offset, screen, or tampon), or ink-jet.

Appropriate substrates for the method in accordance with the invention are sheet, film, or non-woven glass, quartz, ceramic, enamel, paper, polyethylene, polypropylene, epoxide resin, polyester, polycarbonate, polyamide, polyhydantoin, acrylonitrile-butadiene-styrene (ABS) plastic, silicon, polyvinyl halide, or polyvinylidene fluoride. Especially appropriate are substrates of the type employed in printed-circuit boards—phenolic-resin paper, glass-fiber reinforced epoxide, polyester or polyimide sheet, or ceramic for example.

Appropriate fillers are disperse silicic acid and titanium dioxide in particular.

Appropriate activators are in particular those mentioned in European Patent 43 485, 81 129, and 131 195.

The solvents are removed, generally by drying, once the formulations have been applied to the surface of the base.

The surfaces, activated by the formulations are non-electrically metallized in another step. Baths of salts of nickel, cobalt, iron, copper, silver, gold, or palladium or mixtures thereof can be employed. Metallizing baths of this type are known from the technology of non-electric metallization.

Another object of the invention is a method of manufacturing single-layer or multilayer electrically conductive patterns with integrated free-standing connection and plugging sections by applying a formulation containing an organometallic activator to the surface of the substrate followed by wet-chemistry non-electric metallization, characterized in that both the circuit paths and the connection and plugging sections are metallized in one operation wherein the metal coating is deposited in those sections with such little adhesion that it can easily be loosened from the surface of the substrate without damaging it.

Adhesion can be determined for example by the methods described in DIN 40 633, 53 151, and 53 494 (VIC). The coatings in the connection section will exhibit adhesions of less than 15 Newtons/inch and preferably of 1 to 10 Newtons/inch.

There are several versions of the method that will result in metal coatings with diminished adhesion.

One version comprises varying the type and content of the binders and fillers in conventional inks. Such measures are generally known from printing technology.

Decreasing the percentage of the commonly employed AEROSIL® SILICIC ACID for example from 40% to 25% by weight of the binder in a formulation that contains polyurethane elastomers will reduce the adhesion of a metal coating deposited on it from more than 20 Newtons/25 mm to approximately 5 Newtons/mm. The fillers will also reduce adhesion if graphite or talc is added.

When acrylic hardeners are employed, adhesion can be reduced by decreasing the percentage of acrylonitrile or by inserting longer aliphatic side chains into the acrylate components.

Such adhesion-reducing additives as non-ionic tensides, alkyl sulfonates, soaps, paraffins, and silicones are often practical.

Another approach is to employ only formulations with satisfactory adhesion and to reduce it in the connection sections by means of preliminary chemical or physical treatment of the substrate. Examples of preliminary chemical treatment are separator coatings, lacquers, etches, and vapor deposition. Preliminary physical treatments include sandblasting and corona discharging.

Silicones are particularly effective separators. Chromosulfuric acid for example is an appropriate etch. The vapor deposition can involve siloxanes.

Finally, the connection and plugging sections can be produced on a different substrate that is attached to the base substrate by welding, cementing, or coating for example. The other substrate can reduce the adhesion of the electrically conductive patterns produced on it by metallization. It is, however, also possible to employ materials that can later be easily removed, by dissolving them in etches or solvents for example.

The advantage of this version is that the base substrate will not have to be removed once the free-standing patterns have been loosened.

Examples of how metal coatings can be deposited onto formulations that contain organometallic activators will now be described.

The substances are applied only to those areas that are later to be electrically conductive. The intermediate areas are left free. Metal coatings preferably 0.5 to 5 μm thick are then additively deposited and can optionally be galvanically reinforced, subsequent of course to the application of an appropriate contacting structure.

The metal patterns are then loosened from the connection sections as described herein and the substrate optionally removed from the connection and plugging section.

The total metal coating can of course also be built up strictly additively.

Another way of constructing a metal pattern in accordance with the invention is to apply the organometallic substances over the whole surface and to create the pattern semiadditively. Experience has demonstrated that this approach leads to highly precise patterns and is accordingly especially appropriate for producing very fine-conductor patterns. The free-standing parts of the pattern are then loosened as previously described.

The metal patterns can of course also be protected against corrosion. Appropriate processes have long been known in the galvanics and printed-circuit industries. Examples include the application of protective lacquer, nickel, gold, palladium alloys and tin. It is of course also possible to protect only the free-standing connection and plugging sections.

Another manufacturing method is characterized by the application to the connection section of a formulation that loosens from the metallized patterns when heated. The substrate is heated to 60° to 300° C., preferably to 100° to 250° C., and especially to 100° to 200° C.

It is practical to decrease by appropriate means the melting point of the thermoplastic binder employed This can be attained in polyurethane elastomers for example by increasing the percentage of aliphatic components or by decreasing the (isocyanate) coefficients.

Circuits manufactured by the method in accordance with the invention can be employed in a wide range of applications as for example flexible or rigid circuits or patterns in shielding, keyboards, sensors, continuous conductors, and sheet connectors. The electrically conductive patterns in accordance with the invention can of course, once they have been manufactured, be partly or completely protected by applying various substances. Procedures of this type (spraying, imprinting, sputtering, immersion, and coating) are generally known in electrical engineering.

Another object of the invention is a multilayer printed circuit with integrated free-standing metal connection sections with the electrically conductive patterns in its individual layers electrically separated from those in other layers by intermediate layers of insulation, especially printed layers. The patterns in these circuits consist of metal coatings non-electrically deposited with a substance that contains an activator on the insulating surface of the base and of the particular intermediate insulating layer. When the patterns in the individual layers are to be electrically connected, the intermediate insulating layer will have perforations to allow mutual contact and the substance will be printed onto all or part of the pattern on the lower layer. This approach will surprisingly maintain electrically conductive contact between the lower layer of metal that the substance covers partly or completely and metal coating non-electrically deposited on the substance.

Free-standing electrically conductive metal patterns can also be produced in the connection and plugging sections of these multilayer circuit by the method in accordance with the invention. Only prescribed layers can be partly loosened and the other layers left without free-standing metal connection sections.

The patterns in accordance with the invention can be employed on printed-circuit boards, sheet connectors, and for tape bonding.

EXAMPLES

All parts are by weight.

EXAMPLE 1

A. A flexible connecting pattern without pins is printed on a sheet of PET 125 μm thick in a catalytically active screening ink consisting of
650 parts of a 30% solution of a polyurethane elastomer of butanediol adipate (mol. wt. 2000), neopentyl glycol, and 4,4'-diphenylmethane diisocyanate in propylene-glycol methylether acetate,
330 parts of glycol methylether acetate,
55 parts of AEROSIL ® silicic acid (380 m²/g by BET),
52 parts of BLUE ® 15 pigment (C.I. 74 160), and
13 parts of butadienepalladium chloride
and dried for 10 minutes at 150° C.

B. The connection sections are completely printed in an ink consisting of
100 parts of a 30% solution of the foregoing polyurethane elastomer,
20 parts of PRINTEX ® lamp black V),
2 parts of 3-hepten-2-one-palladium chloride, and
2 parts of diethylene glycol
and the printed pattern is dried for 1 hour at 150° C.

The impressions are non-electrically coppered for 1 hour in a copper bath containing formalin and galvanically reinforced to 20 μm.

The result is a sheet connector with connection sections that can easily be separated mechanically from the base.

EXAMPLE 2

A. A sheet-connector pattern without connection sections is printed on a sheet of polyamide CAPTON ® 75 μm thick in a catalytically active screening ink consisting of
260 parts of a 20 solution of a polymer of trimellitic acid anhydride, 4,4'-diphenylmethane diisocyanate, and E. capsilon caprolactam in N-methylcaprolactam,
130 parts of methoxypropyl acetate,
2.2 parts of butadiene-palladium dichloride, and
20 parts of AEROSIL ® SILICIC ACID (380 m²/g by BET)
and dried under pressure for 10 minutes at 160° C.

B. Connection sections are then completely printed with an ink consisting of
66 parts of a 60% solution of a polymer of 50 parts of methyl methacrylate, 20 parts of n-butyl acrylate, and 30 parts of acrylonitrile in methoxypropyl acetate,
50 parts glycol methylether acetate,
4 parts of Aerosil ® (200 m²/g by BET), and
1 part of 3-hepten-2-one-palladium chloride
and dried for 1 hour at 200° C.

The printed sheet is then non-electrically coppered for 5 hours in a copper bath containing formalin. The result is sheet connector that the connection sections loosen from when rapidly heated to 130° C.

EXAMPLE 3

The eventual connection sections of a sheet connector are stencil-sprayed onto a sheet of polyethylene terephthalate with a 0.1% solution of methyl polysiloxane in test benzine and allowed to dry.

The overall sheet-connector pattern is then printed in the screening ink described in Example 1A, dried for 1 hour at 150° C., and non-electrically coppered for 1 hour. The coppered pattern is then galvanically reinforced to 35 μm. The result is a sheet connector with connection sections that can easily be mechanically loosened from the base.

EXAMPLE 4

One side of a polyamide sheet 50 μm thick is completely coated with the formulation described in Example 2A. The coated sheet is dried for 45 minutes at 250° C. and non-electrically coppered for 1 hour in a copper bath containing formalin. The negative of a chip carrier with 84 connections is applied with galvanoresist to the surface of the copper and the uncovered areas are galvanically built up with 10 μm of copper, approximately 2 μm of nickel, and approximately 3 μm of gold. The resist is stripped and the areas of copper between the circuit paths etched away. An alkali resistant etch resist is printed on each side with the eventual connection and plugging sections left open. The base material is etched away in these areas with a hot potassium hydroxide solution. Removing the resist leaves a chip-carrier with free-standing connection and plugging sections.

EXAMPLE 5

An area without the eventual connection sections is printed on a sheet 75 μm thick in a catalytically active screening ink consisting of
200 parts of a 20% solution of a polyurethane elastomer of butanediol polyadipate (mol. wt. 1500) and toluylene diisocyanate in propylene glycol methylether acetate,
54 g of titanium dioxide,
60 g of butyl glycolate, and
1.4 g of bis-acetonitrile-palladium dichloride.
The areas are then printed with the ink described in Example 2B.

The printed areas are dried for 1 hour at 150° C., non-electrically coppered in a copper bath containing formalin, and galvanically reinforced to 20 μm. A resist is applied and a sheet-connector pattern etched with plugging sections that can easily be mechanically removed.

It will be appreciated that the instant specification and claims are set forth by way of illustration and not limitation, and that various modifications and changes may be made without departing from the spirit and scope of the present invention.

I claim:

1. A method for manufacturing single-layer or multilayer electrically conductive patterns, having integrated free-standing connection and plugging sections, on bases wherein said integrated free-standing connection and plugging sections can be easily separated from said bases without damage, which comprises applying formulations that contain organometallic activators to the surfaces of base materials followed by metallization by electroless deposition to form the electrically conductive patterns with integrated free-standing connection and plugging sections, wherein the organometallic activator-containing formulations that are applied to those portions of the base material surfaces upon which the integrated free-standing connection and plugging sections are to be formed are formulations which, when dried, have such a low adhesion for the connection and plugging sections to be formed that said connection and plugging sections, once formed, can be easily separated therefrom without damage.

2. The method according to claim 1, wherein the base employed for the connection and plugging sections differs from the base of the conductive pattern and exhibits a lower adhesion to metal coatings.

3. A method for manufacturing single-layer or multilayer electrically conductive patterns having integrated free-standing connection and plugging sections, on bases wherein said integrated free-standing connection and plugging sections have a lesser adhesion strength than the remainder of the conductive pattern and can be loosened from said bases by heating to 60° C. to 300° C. which comprises applying formulations that contain organometallic activators to the surfaces of bases, followed by metallization by electroless deposition to form electrically conductive patterns with integrated free-standing connection and plugging sections, wherein the activator formulations applied to those portions of the base material surfaces upon which the integrated free-standing connection and plugging sections are to be formed contain a thermoplastic binder which allows the connection and plugging sections, once formed, to loosen when heated to 60° C. to 300° C. while the remainder of the electrically conductive patterns continue to adhere.

4. The method according to claim 3, wherein the adhesion in the connection and plugging sections is decreased by preliminary physical or chemical treatments.

5. The method according to claim 3, wherein the activator formulation applied to those portions of the base material surfaces upon which the integrated free-standing connection and plugging sections are to be formed allows the metal coating to loosen when heated to 100° to 250° C.

6. The method according to claim 3, wherein the formulation applied to those portions of the base material surfaces upon which the integrated free-standing connection and plugging sections are to be formed contains a polyurethane binder and a disperse silicic acid as filler.

7. A method for manufacturing single-layer or multilayer electrically conductive patterns, having integrated free-standing connection and plugging sections, on bases wherein said integrated free-standing connection and plugging sections can be easily separated from said bases while the remainder of said conductive patterns remain on the bases without damage and without disconnecting said connecting and plugging sections from the remainder of said conductive patterns, which comprises applying formulations that contain organometallic activators to the surfaces of base materials followed by metallization by electroless deposition to form the electrically conductive patterns with integrated free-standing connection and plugging sections, wherein the organometallic activator-containing formulations that are applied to those portions of the base material surfaces upon which the integrated free-standing connection and plugging sections are to be formed are different than the formulations applied to those portions of the base material surfaces upon which the remainder of the electrically conductive patterns are to be formed, the formulations being applied to the portions of the base material surfaces upon which the integrated free-standing connection and plugging sections are to be formed being formulations which, when dried, have such a low adhesion for the connection and plugging sections to be formed that said connection and plugging sections, once formed, can be easily separated therefrom without damage while the formulations that are applied to the portions of the base material surfaces upon which the remainder of the electrically conductive patterns are to be formed are formulations which, when dried, have such a high adhesion for the remainder of the electrically conductive patterns that said remainder of the electrically conductive patterns become permanently affixed to said bases, and remain affixed to said bases when said connection and plugging sections are separated from said bases, and separating said plugging and connection sections from said bases without separating said plugging and connection sections from the remainder of said electrically conductive patterns.

8. The method according to claim 7, wherein the formulations contain a polyurethane binder and a disperse silicic acid as filler.

9. The method according to claim 7, wherein the adhesion in the connection and plugging sections is less than 15 N/inch.

* * * * *